US007630592B2

(12) United States Patent
Neyer et al.

(10) Patent No.: US 7,630,592 B2
(45) Date of Patent: Dec. 8, 2009

(54) METHOD FOR THE PRODUCTION OF ELECTROOPTICAL PRINTED CIRCUIT BOARDS COMPRISING POLYSILOXANE WAVE GUIDES AND USE THEREOF

(75) Inventors: Andreas Neyer, Iserlohn (DE); Erik Rabe, Dortmund (DE); Stefan Kopetz, Hagen (DE)

(73) Assignee: Universität Dortmund, Dortmund (DE)

( * ) Notice: Subject to any disclaimer, the term of this patent is extended or adjusted under 35 U.S.C. 154(b) by 103 days.

(21) Appl. No.: 10/575,125

(22) PCT Filed: Oct. 8, 2004

(86) PCT No.: PCT/DE2004/002242

§ 371 (c)(1),
(2), (4) Date: Apr. 7, 2006

(87) PCT Pub. No.: WO2005/036221

PCT Pub. Date: Apr. 21, 2005

(65) Prior Publication Data

US 2007/0122073 A1 May 31, 2007

(30) Foreign Application Priority Data

Oct. 10, 2003 (DE) ............................. 103 47 331

(51) Int. Cl.
*G02B 6/12* (2006.01)
*G02B 6/10* (2006.01)
(52) U.S. Cl. ..................... 385/14; 385/131; 385/132
(58) Field of Classification Search ................. 385/14, 385/129–132
See application file for complete search history.

(56) References Cited

U.S. PATENT DOCUMENTS 5,521,992 A 5/1996 Chun et al.

(Continued)

FOREIGN PATENT DOCUMENTS

DE 195 23 580 2/1996

(Continued)

OTHER PUBLICATIONS

Kopetz S. et al: "Coupling of optoelectronic modules to optical layer in printed circuit boards (PCBs)" Proceedings of the SPIE—The International Society for Optical Engineering SPIE—Int. Soc. Opt. Eng USA vol. 4942, Oct. 30, 2002, pp. 282-286, XP002315409 ISSN: 0277-786X (ISR) (Enclosed).

(Continued)

*Primary Examiner*—Daniel Petkovsek
(74) *Attorney, Agent, or Firm*—Collard & Roe, P.C.

(57) ABSTRACT

The invention relates to the production of an electrooptical printed circuit board (EOLP) and to the use thereof. The optical layer in the printed circuit board is made of highly transparent and soldering bath-resistant polysiloxane wave guides. The polysiloxane wave guides are produced according to casting techniques, and the ends of the wave guides can comprise deviating mirrors which are integrated at 45°. During the casting process of the printed circuit board, the substrate layers and the supersubstrate layers made of polysiloxane are brought into contact with printed circuit board materials having microstructured spacers which are used to define the thickness of the substrate layer and/or the thickness of the supersubstrate layer. Openings are located in the printed circuit board material above the deviating mirrors, such that vertical light decoupling and coupling can take place. The printed circuit board can be applied to rigid or flexible carrier materials as an optical link circuit, or can be used as an optical layer in a multilayer-board composite or as an integrated optical component.

28 Claims, 2 Drawing Sheets

U.S. PATENT DOCUMENTS

| | | | |
|---|---|---|---|
| 5,764,820 A * | 6/1998 | De Dobbelaere et al. | 385/14 |
| 5,917,980 A * | 6/1999 | Yoshimura et al. | 385/129 |
| 6,088,492 A | 7/2000 | Kaneko et al. | 385/14 |
| 2003/0006068 A1 | 1/2003 | Tourne | 174/261 |
| 2003/0007745 A1 | 1/2003 | Martwick | 385/88 |
| 2003/0080472 A1* | 5/2003 | Chou | 264/338 |
| 2003/0108269 A1 | 6/2003 | Pogge et al. | 385/14 |
| 2003/0179979 A1 | 9/2003 | Ouchi | 385/14 |

FOREIGN PATENT DOCUMENTS

| EP | 1 142 682 A | 10/2001 |
|---|---|---|

OTHER PUBLICATIONS

Griese E. et al: "Self-aligned coupling of optical transmitter and receiver modules to board-integrated optical multimode waveguides" Proceedings of the SPIE—The International Society for Optical Engineering SPIE—Int. Soc. Opt. Eng USA, vol. 4455, Jul. 29, 2001, pp. 243-250, XP002315410 ISSN: 0277-786X (ISR).

Lehmacher S. et al: "Integration of Polymer Optical Waveguides Into Printed Circuit Boards (PCB)" Proceedings. Micro. Tec. VDE World Microtechnologies Congress, Proceedings of International Conference on Microtechnologies, XX, XX, Sep. 25, 2000, pp. 111-113, XP001035010 (ISR and Spec) (Enclosed).

Mitsuo Usui et al., "Low-loss passive polymer optical waveguides with high environmental stability," Journal of Lightwave Technology, vol. 14, 1996, pp. 2338-2343.

\* cited by examiner

Fig.1

METHOD FOR THE PRODUCTION OF ELECTROOPTICAL PRINTED CIRCUIT BOARDS COMPRISING POLYSILOXANE WAVE GUIDES AND USE THEREOF

CROSS REFERENCE TO RELATED APPLICATIONS

Applicants claim priority under 35U.S.C. §119 of German Application No. 103 47 331.9 filed Oct. 10, 2003. Applicants also claim priority under 35U.S.C. §365 of PCT/DE2004/002242 filed Oct. 8, 2004. The international application under PCT article 21(2) was not published in English.

The invention relates to a method for the production of an electro-optical printed circuit board, in accordance with the preamble of claim 1, as well as to the use of such a printed circuit board, in accordance with the preamble of claim 30.

The increasing cycle rate of processors and the accompanying increase in the data rate on computer boards represents a growing challenge to electrical connection technology. In particular, signal integrity can be guaranteed only with great technical effort and financial expense at data rates in the range of multibits per second to gigabits per second. The reason for this lies in the antenna effect of electrical lines in the high-frequency range, both with regard to the transmission effect and with regard to the reception effect.

For this reason, optical connection technologies have been discussed and investigated for many years, since light guides do not show any antenna effect, even at data rates going into the range of terabits per second. The technical problem that must be solved in order to implement an optical connection technology between electrically operating modules (processors) is the integration of optical and electrical conductive media in a common module.

For industrial use, the so-called electro-optical printed circuit board (EOPCB) represents a preferred solution. It consists, for example, of a conventional multi-layer board in which an optical layer is added to the electrical layers. Coupling the light signals into and out of the optical layer can take place by means of micro-mirrors, for example, which are situated at the ends of the waveguides. Such an electro-optical printed circuit board is shown schematically in FIG. 1.

Such an EOPCB is described in the publication "S. Lehmacher, A. Neyer, "Integration of polymer optical waveguides into printed circuit boards (PCB)," Proceedings MICRO.tec 2000, vol. 1, Hanover, September 2000, pp. 111-113." In this connection, the optical layer is produced by means of hot-embossing techniques, in thermoplastic materials such as polycarbonate (PC) or cyclo-olefin copolymer (COC), for example. The optical layer generally survives lamination into the multi-layer board, at temperatures around 160° C., without any additive losses. The high temperature effects in the case of reflow soldering that is required for industrial production, at approximately 230° C., however, result in such significant degradation of the optical polymers, over a period of a few minutes, that it is no longer possible to use the multi-layer board in any meaningful way. Similar concepts, which are also based on hot-embossing methods using thermoplastic materials, were and are being pursued in publicly funded projects (BMBF—Bundesministerium für Bildung und Forschung—[Federal Ministry for Education and Research]), "EOCB," "OPTOSYS," and "OPTICON," with the result that the thermoplastic materials being used do not possess a temperature stability sufficient for printed circuit board integration. In the BMBF project "MOES," epoxy resins that can be photostructured are being used as waveguide materials. Aside from the difficulties of producing coupling mirrors for introduction of the optical signals into and out of the optical layer, there are also stability problems here, at temperatures above 200° C.

The use of the known hot-embossing techniques for the production of optical layers furthermore has the disadvantage that because of the temperatures that act on them, and the necessary pressure, it is not possible to achieve particularly good optical properties of the optical layers produced in this manner. While it is true that the photo-curing materials used in the hot-embossing techniques permit waveguide structuring by means of photo processes or etching processes, simple production of the coupling mirrors required for passing the light into and out of the optical layer is not possible in this connection. On the other hand, while it is true that waveguides having deflection mirrors at their ends can be produced in the case of thermoplastic materials, by means of molding techniques, these are not resistant to the required solder bath temperatures, because of the glass temperatures, which are generally low.

In the U.S. patent application US2003/0006068 A1, "System and method for integrating optical layers in a PCB for inter-board communications," a method for the production of an EOPCB is described, which is based on the lamination of optically transparent polymer films having different indices of refraction, which are structured using laser ablation. The commercial poly-guide system is indicated as being the preferred polymer.

The disadvantages of this method are:

The poly-guide system is acrylate-based and therefore possesses a temperature resistance that is not sufficient for solder bath applications.

Structuring by means of laser ablation causes roughness at the waveguide walls, caused by the process, which results in greater losses. There have been no reports concerning results of this process.

Structuring of the waveguide by means of ablation takes place in serial manner and is therefore very time-consuming and cost-intensive.

The production of coupling-in and coupling-out mirrors, e.g. by means of laser ablation, must take place in serial manner, requires great adjustment precision, and is therefore very time-consuming and cost-intensive.

In the U.S. patent application US2003/0007745 A1, "Optically interconnecting integrated circuit chips," an arrangement is described that is supposed to allow coupling of light-emitting and light-detecting components into an optical layer of a printed circuit board. No statements are made concerning the optical position and the properties of the material systems used. Implementation examples are not mentioned.

Furthermore, methods are known in the literature for producing light guides from polysiloxane materials (Mitsuo Usui et al., "Low-loss passive polymer optical waveguides with high environmental stability," Journal of Lightwave Technology, vol. 14, 1996, pp. 2338-2343). These methods are based on reactive etching processes (RIE) for two-dimensional definition of the lateral waveguide geometries, and therefore demonstrate the known disadvantages of reactive etching processes.

It is therefore the task of the present invention to indicate a method for the production of low-attenuation and highly temperature-stable optical layers that are suitable for process-capable integration into printed circuit boards.

The solution for the task according to the invention results, with regard to the method, from the characterizing features of claim 1 and, with regard to the use, from the characterizing features of claim 30, in interaction with the characteristics of the related preamble, in each instance. Other advantageous embodiments of the invention result from the dependent claims.

The invention with regard to the method proceeds from a method for the production of an electro-optical printed circuit board that has a number of layers having electrically conductive elements and at least one layer having optically conductive elements, particularly having waveguides. Such a method is developed further in such a manner that the at least one optical layer has a polysiloxane material, and that structuring of the elements of the optical layer takes place by means of casting techniques, whereby the mechanical connection between the optical layer and the at least one layer of the electrically conductive printed circuit board layers is produced in direct connection with the production of the optical layer. The use of polysiloxane materials for the production of the optical layer for integration into printed circuit boards allows a temperature stability far above 200° C., and such optical layers can also be subjected to as much as 300° C. for short periods of time. Below, the term polysiloxane is supposed to be understood to mean the entire corresponding material class of silicone polymers that demonstrate correspondingly similar or comparable properties with regard to temperature stability and optical properties. In this way, this material system is excellently suited for use in reflow soldering processes that will require temperatures of almost 300° C. in the case of a future lead-free composition of the solder baths. Currently, the temperature stress in reflow solder baths lies at approximately 230° C. No other polymer system having such properties is known. The casting technique according to the invention, for the implementation of waveguides, particularly polysiloxane waveguides, furthermore offers the possibility, for the first time, of simple three-dimensional structuring of the optical layer, which is essential for parallel production of all of the waveguide structures, particularly also those having integrated coupling mirrors (e.g. with 45° flanks), and therefore for economical production of such printed circuit boards. The connection of the optical layer with at least one layer of the electrically conductive printed circuit board layers that is produced in direct connection, in terms of time, with the casting-technology production of the optical layers, furthermore allows a significant improvement in the handling of the optical layer, which is usually configured to be very thin, in the range of only 100-200 µm, and therefore is not very stable mechanically, and additionally is elastic. Because of this, handling for the further production of a printed circuit board is difficult, after removal of the optical layer from a corresponding production mold, which is already quite difficult. However, by means of binding onto the one layer of the printed circuit board, this handling problem is eliminated, to a great extent, since the printed circuit board itself is configured to be significantly more stable mechanically than the optical layer, and therefore is also simpler to handle. The printed circuit board layer therefore stabilizes the optical position for the further production process. In this way, even positioning processes in the course of further production, between optical layer and the printed circuit board, for example, can be carried out with the greatest precision, thereby making it possible to eliminate adjustment processes, e.g. within the framework of connecting the optical layer to electrical components, which were previously necessary. Thus, for example, the printed circuit board layer can be positioned relative to the casting mold of the optical layer, before the optical layer is removed from the mold, and this is much simpler than positioning relative to a resilient optical layer that has already been removed from the mold, for example.

It is particularly advantageous, in this connection, if the mechanical connection between the optical layer and the at least one layer of the electrically conductive printed circuit board layers is produced directly during the production of the elements of the optical layer. In this way, all handling procedures of the optical layer as an independent element, within the framework of further production of the printed circuit board, are eliminated, in that the optical layer can already be connected with the printed circuit board within the framework of its own production.

In-situ connecting of optical layer and printed circuit board prevents all error sources, such as damage and positioning errors, which otherwise cannot be avoided because of the poor ability to handle the optical layer as a single component. In this way, the production process of combined electro-optical printed circuit boards can be significantly improved and structured to be more reliable.

An advantageous embodiment of the invention provides that the optical layer is formed from a core polysiloxane having a higher index of refraction, as well as a polysiloxane as a superstrate layer, having a low index of refraction, and a polysiloxane as a substrate layer, having a low index of refraction, in the form of cover layers on the core polysiloxane. In this way, the particular advantages of polysiloxane materials, with regard to the temperature stability and the high optical quality, can be combined well with one another, if all the layers forming the optical layer are formed from such polysiloxanes. The connection between similar types of materials can also be produced in simple manner, in this connection; furthermore, the temperature behavior is also identical, to a great extent.

In a first advantageous embodiment, the superstrate polysiloxane is applied to the core polysiloxane, which has already solidified, in liquid form; afterwards, it is brought into connection with a layer of the electrically conductive printed circuit board layers in its liquid phase, and subsequently cross-linked. In this method of procedure, the superstrate layer is applied directly to the core polysiloxane, without the core polysiloxane having to be removed from the casting mold. In an equivalent embodiment, however, it is also possible that the substrate polysiloxane is applied to the core polysiloxane, which has already solidified, in liquid form, brought into connection with a layer of the electrically conductive printed circuit board layers in its liquid phase, and subsequently cross-linked. In this way, either the substrate layer or the superstrate layer can optionally be applied to the core polysiloxane, depending on what method of procedure is more advantageous for further production of the printed circuit board. By means of applying the layer of the printed circuit board onto the substrate layer or superstrate layer, respectively, which is still liquid, the layer of the electrically conductive printed circuit board can be fixed in place on the polysiloxane layer in mechanically secure manner and without any additional work step, after subsequent cross-linking of this polysiloxane layer. By means of covering the superstrate layer or the substrate layer, which has been cast on, with the printed circuit board material, the optical layer is, at the same time, firmly connected with the printed circuit board material. Subsequent lamination or gluing of the optical layer to the printed circuit board material is also possible technically, but than an additional lamination step or gluing step must take place.

The composite of superstrate layer/core polysiloxane and the substrate layer can be produced in particularly advantageous manner if pit structures of a casting mold are filled with polysiloxane having a higher index of refraction, and hardened, in a first step; a polysiloxane having a low index of refraction is applied as a superstrate layer, in a second step, in such a manner that it bonds to the core polysiloxane; the superstrate layer with the optically conductive elements situated on it are separated from the casting mold, in a third step; and a polysiloxane having a low index of refraction is applied to the core polysiloxane as a substrate layer, in a fourth step. In this connection, the core polysiloxane first fills the casting mold, and is subsequently covered with the superstrate layer, and subsequently the substrate layer is applied after unmolding of the composite produced in this manner, in a separate work step.

However, it is also possible for the polysiloxane substrate having the low index of refraction to be produced by means of casting technology, with pit structures, in a first step; for a core polysiloxane having a higher index of refraction to be filled into the pits in a second step; and for a polysiloxane having a low index of refraction to be applied to the composite of polysiloxane substrate/core polysiloxane as a superstrate layer, in a third step.

It is particularly advantageous with regard to the precision of production of superstrate layer or substrate layer, respectively, if the layer of the electrically conductive printed circuit board layers has micro-structured spacers on the side facing the liquid polysiloxane of the substrate layer or the superstrate layer, respectively, which guarantee a defined thickness of the substrate layer or superstrate layer, respectively. By means of the introduction of such support structures on the printed circuit boards, which function as spacers, very thin superstrate and substrate layer thickness values of a few 10 µm become possible, which would not have sufficient mechanical stability in a non-supported embodiment. However, structure methods producing layers that are as thin as possible are very advantageous for integration into multilayer boards.

In another embodiment of the invention, with regard to the connection between optical layer and printed circuit board, it is also possible that the mechanical connection between the optical layer and the at least one layer of the electrically conductive printed circuit board layers is produced subsequent to production of the optical layer. In this connection, the optical layer is first pre-finished, completely or almost completely, and only then connected with the printed circuit board layer, however without any intermediate steps. In this way, the result is achieved that the production of the optical layer can take place in an advantageous sequence, and after completion of the work on the optical layer, the latter is connected with the printed circuit board layer as a whole. Starting from this point in time, the composite of optical layer and printed circuit board layer can again be handled as a whole, in the sense already described. In this connection, the optical layer can be mechanically brought into connection with one or more layers of the electrically conductive printed circuit board layers either on one or both sides. The production of a connection between the optical layer and a layer of the electrically conductive printed circuit board layers can take place in fundamentally known manner, by means of lamination or gluing.

A particularly good connection between printed circuit board layer and optical layer can also be achieved if adhesion promoters are used to support the connection between the polysiloxane of the optical layer and the layer of the electrically conductive printed circuit board layers. In this connection, it must be noted that only substances that do not attack the optical layer in the long term or impair its optical properties are allowed to be used as adhesion promoters. Thus it is possible, for example, that a polymer layer that adheres well to the layer of the electrically conductive printed circuit board layers is applied as an adhesion promoter, which demonstrates reliable adhesion to both connection partners, for one thing, and is chemically neutral with regard to the connection partners.

In another embodiment for improving the adhesion between printed circuit board layer and optical layer, it is also possible for a physical and/or chemical treatment of the surface of the layer of the electrically conductive printed circuit board layers, which layer is connected with the optical layer, to be performed in order to achieve activation of the surface for improved adhesion to the optical layer. Such treatment, which can be carried out, for example, by means of flaming with gases, or also by means of plasma irradiation, and has a positive influence on the surface of the printed circuit board layer, in terms of its adhesion properties with regard to the optical layer, results in chemical and/or physical activation of the surface and therefore in better adhesion.

It is significantly advantageous for the production of the electro-optical printed circuit board if the casting techniques for structuring the optically conductive elements are carried out essentially at ambient temperatures. In this way, it is possible to work without the heating of the materials that is otherwise necessary, such as in the case of known heat-embossing, and without the material influences that accompany it; also, it is possible to reliably avoid distortion of the optical layer due to temperature expansion processes or chemical changes. It is also advantageous in this connection that when casting the optically conductive elements, the surface of the cast optically conductive elements is drawn off by means of ductors, and therefore the casting mold is completely filled. Therefore, a uniformly good impression of the casting mold on the optical layer is always formed, and therefore uniform optical properties of the optical layer can be achieved. By means of the casting techniques for structuring the optically conductive elements, large-area structures of the optically conductive elements can also be produced. In this way, waveguides having very large cross-sections—such as 1 mm×1 mm, for example—as well as waveguides having great length expanse can be produced in simple manner. It is not possible to produce such large structures using the LIGA technology, for example, in cost-effective manner.

A particularly advantageous effect of the polysiloxane material used according to the invention can be achieved in that the polysiloxane material can also be formed from casting technology depressions having very steep walls or depressions having undercuts, without impairment, because of its elastic properties. While it is true that the thick-varnish structures frequently used for the production of casting molds by means of lithographic methods, such as the varnish Negativresist SU/8, have a particularly good surface quality, they frequently form undercuts within the casting mold, because of different shrinkage processes, which make it difficult or impossible to remove the optical layer, which is not very stable, from the mold. This is presumably attributable to different cross-linking processes within the varnish as it hardens under the influence of light. Such undercuts have the result, during unmolding of quite rigid materials for optical layers, which are otherwise frequently used, that either the optical layers are damaged, or they become unusable, or the casting mold is damaged and therefore can only be used once. Because of the elasticity of the polysiloxane, optical layers produced from it can be unmolded without problems even if there are undercuts in the casting mold, since non-destructive unmolding of the polysiloxane is possible because of its elasticity.

It is furthermore advantageous if the coupling elements for optical coupling of the optically conductive elements to electrically conductive elements of the electrically conductive printed circuit board layers to be functionally connected can be produced at the same time when the layer having the optically conductive elements is cast. For this purpose, the casting molds for the optically conductive elements, for example, can possess beveled flanks at the ends, preferably at 45°; segments of the optical layer that are molded on in the optical layer can be metallized locally by means of these flanks after unmolding, and then possess the function of integrated deflection mirrors. In this way, production of such coupling elements that is integrated into the production of the optical layer is possible, thereby avoiding adjustment operations of separately produced coupling elements and therefore unavoidable errors or high cost expenditures.

With regard to the configuration of the elements of the optical layer, it is advantageous if the optically conductive elements of the optical layer contain intersections, branches, mixers, wavelength multiplexers and wavelength de-multiplexers, and switching elements. All of the required properties of the optical layer, which are necessary for use in multi-layer boards, can be built up with these and, of course, also with other known optically conductive elements, to a great extent.

Also covered by the invention is the use of an opto-electrical printed circuit board, in which additional layers of the printed circuit board or additional printed circuit boards are added on one or on both sides of the composite of optical layer and layers of the printed circuit board that are connected with the optical layer, produced according to the method, to produce a multi-layer composite. In this way, even complex circuit designs can be implemented, which can be designed in application-specific manner. Another way of using the opto-electrical printed circuit board can consist in applying the composite of optical layer and layers of the printed circuit board connected with the optical layer, produced according to the invention, to a rigid or also a flexible carrier medium. In this way, the carrier medium can also be adapted to the purpose of use.

The method according to the invention, presented once again on the basis of a closed method sequence, which, however, is presented only as a possible example, can comprise the following steps:

The starting point is a suitable casting mold, in which the waveguide structures are present as pits and the pit ends are provided with 45° bevels. Such casting molds can be produced using various micro-technologies, such as, for example, micro-etching techniques in silicon, LIGA technology, UV lithography, or by means of micro-mechanical machining methods. The pits of the casting mold are subsequently filled with a liquid silicone polymer having a high index of refraction with the number $n_2$. During filling, attention must be paid to ensure that no residual film having a thickness greater than 1 μm remains in the regions next to the waveguide pits. In this connection, the preferred technology for precise filling of the pits is ductor technology, with which particularly good filling of the waveguide pits is made possible. After filling, cross-linking of the polysiloxane polymer takes place. The material that has hardened in the pits forms the core polymer of the light guides to be produced.

Subsequently, the casting mold with the cured light guide cores is covered by pouring on a polysiloxane polymer having a low index of refraction with the number $n_1$ ($n_1 < n_2$), and covered with a panel of printed circuit board material. The printed circuit board material possesses mechanical support structures on the side facing the casting mold, which function as spacers and guarantee a defined thickness of the layer to be produced (superstrate) during a pressing process of the printed circuit board material against the casting mold. In this connection, it must be guaranteed that the support structures are affixed next to the waveguide structures and do not have any contact with the waveguide structures. The support structures can also be produced by means of mechanical methods, but preferably by means of structured etching of a correspondingly thick copper layer. In addition, the printed circuit board material is cleared in the regions under which coupling mirrors are situated. After the pressing process, the superstrate polymer is cross-linked.

The printed circuit boards that are used can consist either of fiberglass-reinforced epoxy resin, such as FR4, for example, or of Kapton, Teflon, glass, or other suitable dielectric carrier materials. The printed circuit boards can either be completely without an electrically conductive layer, or be provided with a conductive layer on one or also both sides. The electrically conductive layers can either not be structured at all, or structured as electrical conductor tracks on one or both sides.

The composite of waveguide core/superstrate/printed circuit board material produced in this manner is separated from the casting mold. The exposed 45° bevels at the waveguide ends are locally metallized using a shadow-mask technique, and subsequently have the function of integrated coupling mirrors.

The waveguide core layer is then covered by pouring on a polysiloxane having a low index of refraction with the number $n_3$ ($n_3 < n_2$), which forms the waveguide substrate layer and preferably has the same index of refraction $n_1$ as the superstrate. The substrate polymer layer, which is still liquid, is also covered with a layer of printed circuit board material, which contains mechanical support structures that function as spacers and guarantee a defined substrate layer thickness after a pressing process.

Alternatively to this method, described above, a polysiloxane substrate having a low index of refraction can also be produced with waveguide pits, which is connected with a printed circuit board material during production, in the first step. In the second step, the ditches are filled with polysiloxane material that has a higher index of refraction, whereby again, ductor technology is preferred. In the last step, the composite of printed circuit board/waveguide substrate/waveguide core is coated with a polysiloxane layer that has a low index of refraction, the superstrate, and, as mentioned above, covered with printed circuit board material during the liquid phase.

Both methods lead to the result of an optical layer of polysiloxane that is integrated into a printed circuit board. Preferably, however, the first method should be used, since the second method demonstrates the limitation that during the pit filling process, ductoring must take place on the relatively soft polysiloxane substrate. In this connection, the ductor presses into the soft substrate surface, which can result in incomplete filling of the pits. This in turn results in geometrical variations of the cross-sections of the light guides, and thereby in increased waveguide losses.

A particularly preferred embodiment of the method according to the invention is shown in the drawing.

This shows.

Figure 1:
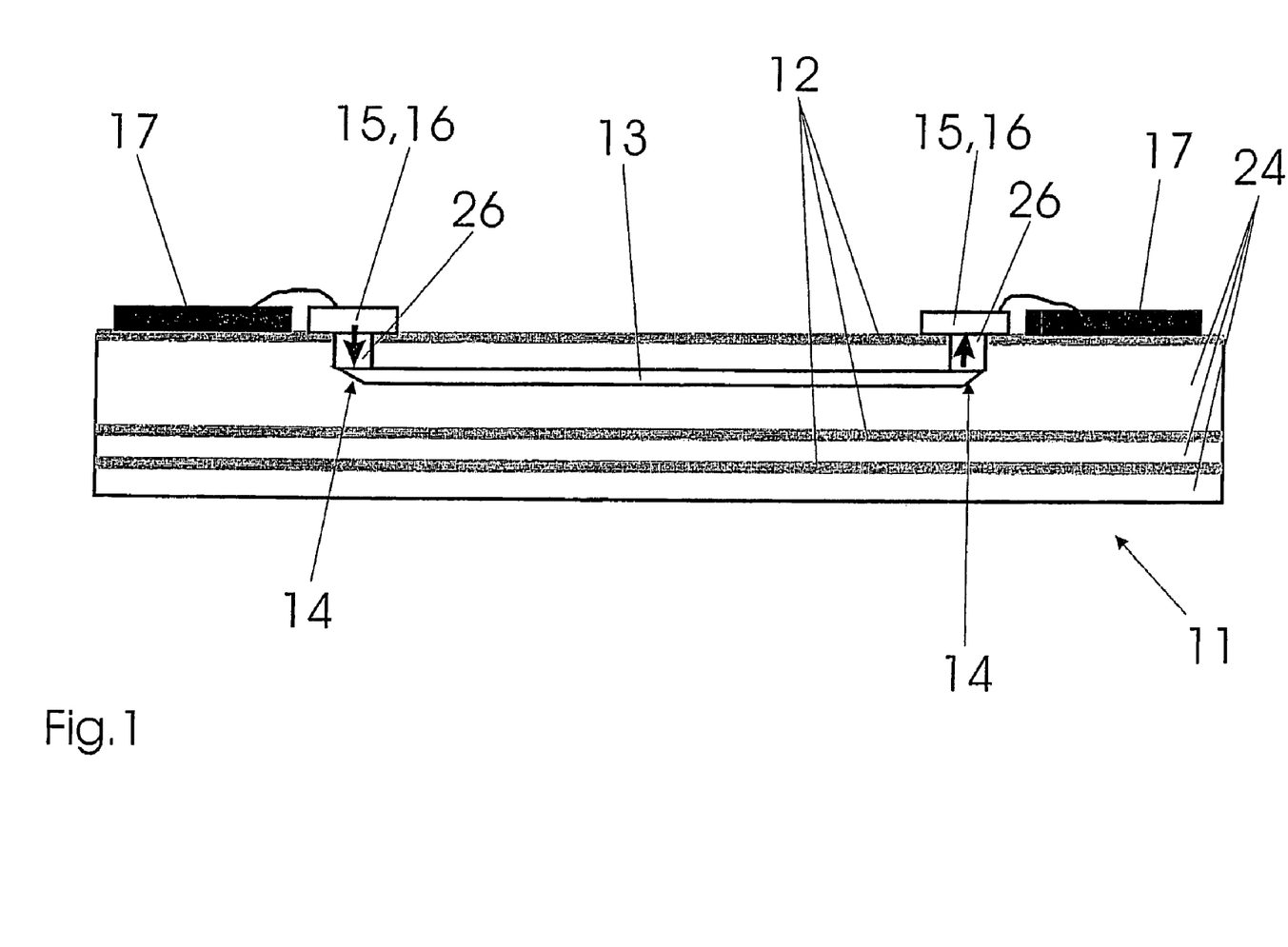
FIG. 1—the structure of an opto-electrical printed circuit board fundamentally known from the state of the art, FIG. 2—the sequence of a method sequence according to the present invention, shown in exemplary and simplified manner.

FIG. 1 shows the schematic structure of a known electro-optical printed circuit board (EOPCB). In this connection, an optical layer 13 is inserted into a multi-layer board 11, along with the layers 24 having electrical conductor tracks 12. The former has the function of an optical connection between two processors 17. The electrical signals of the processors 17 are converted to optical signals by means of electro-optical converters, i.e. transmitters 15, passed into the multi-layer board 11 through corresponding openings 10, coupled into the optical layer 13 there, by means of deflection mirrors 14, coupled out of the optical layer 13 again by way of deflection or coupling mirrors 14, and passed to an electro-optical converter, i.e. receiver 16. The latter supplies the electrical signals to the processor 17 being addressed, in each instance, which the latter can process. The production and inclusion of the optical layer 13 into the composite of the layers of the multi-layer board 11 is a problem in the production of such an electro-optical printed circuit board 11.

FIG. 2 shows the production sequence for the production of the optical layer 13 and the polysiloxane waveguide 22 disposed within it, according to the present invention, by means of casting technology, and integration into a printed circuit board 11.

Figure 2A:
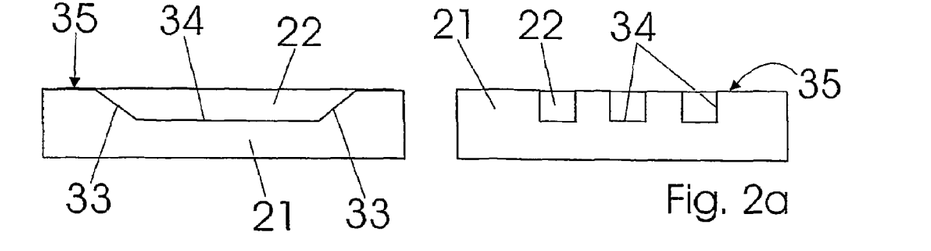

FIG. 2a shows a suitable casting mold 21, in which the waveguide structures are present as a negative mold, in the form of pits 34, and the pit ends 33 are provided with 45° bevels. Such casting molds 21 can be produced by means of various micro-technologies, such as micro-etching techniques in silicon, LIGA technology, UV lithography, or by means of micro-mechanical machining methods. The pits 34 are filled precisely to their upper edge 35 with a liquid silicone polymer 22 having a higher index of refraction with the number $n_2$. After filling, cross-linking of the polysiloxane polymer 22 takes place. The silicone polymer that has hardened in the pits 34 forms the core polymer of the light guides to be produced.

Figure 2B:
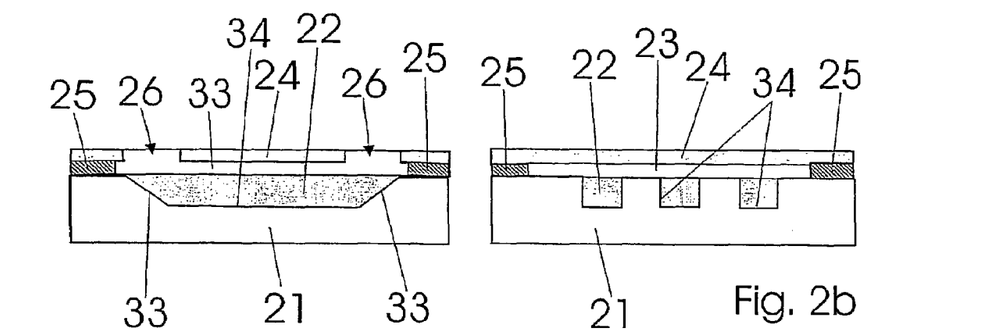

In FIG. 2b, the casting mold 21 with the hardened light guide cores 22 is covered by pouring on a polysiloxane polymer 23 having a low index of refraction with the number $n_1$ ($n_1 < n_2$), and covered with a panel 24 of printed circuit board material. The printed circuit board material 24 possesses mechanical support structures 25, which function as spacers, on the side facing the casting mold 21. During a pressing process, not shown, the printed circuit board material 24 is pressed against the casting mold 21 and thereby guarantees a defined thickness of the layer 23 of the superstrate formed in this manner, to be produced. By means of the positioning of the support structures 25, it is guaranteed that these are affixed next to the waveguide structures 22 and do not come into contact with them. The support structures 25 can be produced, for example, by means of structured etching of a correspondingly thick copper layer.

In addition, the printed circuit board material 24 is cleared with openings 26 in those regions under which coupling mirrors 33 are situated. After the pressing process, the superstrate polymer 23 is cross-linked.

Figures 2C, 2D:
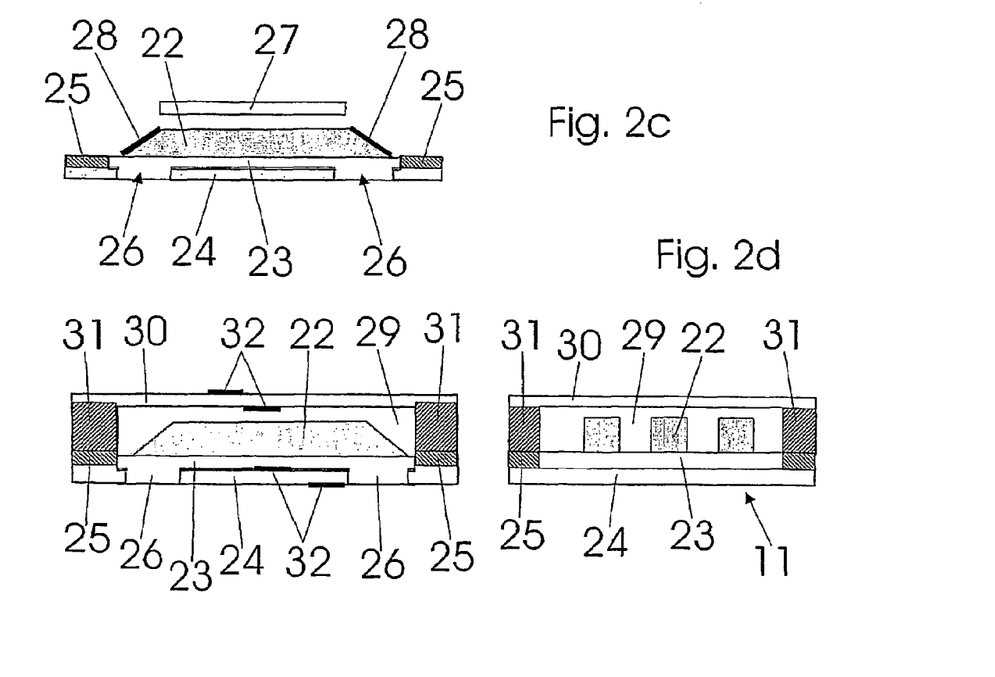

FIG. 2c shows the composite waveguide core/superstrate/printed circuit board material 22, 23, 24, after it was separated from the casting mold 21. Furthermore, it is shown how the exposed 45° bevels at the waveguide ends 33 are locally metallized 28 using a shadow mask 27. After this technology step, they have the function of integrated coupling mirrors.

FIG. 2d shows the waveguide core layer 22, after it was covered by pouring on a polysiloxane polymer 29 having a low index of refraction with the number $n_3$ ($n_3 < n_2$) This layer forms the waveguide substrate layer 29 and preferably possesses the same index of refraction $n_1$ as the superstrate 23. The substrate polymer layer 29, which is still liquid, is also covered with a panel 30 of printed circuit board material, which contains mechanical support structures 31 that function as spacers and guarantee a defined substrate thickness after a pressing process.

The structure shown in FIG. 2d represents an electro-optical printed circuit board 11, whereby the two printed circuit boards 24, 30 can be equipped with electrical components, not shown in detail, on the outsides. Electrical conductor tracks 32 can be affixed on both sides of the printed circuit boards 24, 30.

Preferably, however, the structure shown in FIG. 2d is integrated into a multi-layer board 11.

Preferably, the standard board material FR4 is used as printed circuit board materials. However, materials such as aluminum, copper, Teflon, Kapton, and also glass, for example, are also possible for embedding the optical layer 13.

REFERENCE NUMBER LIST

11—multi-layer printed circuit board/electro-optical printed circuit board
12—conductor track
13—optical layer
14—deflection mirror/coupling element
15—transmitter
16—receiver
17—processor
21—casting mold
22—waveguide/core polysiloxane layer/optically conductive element
23—superstrate layer
24—printed circuit board
25—support element
26—break-through/opening
27—shadow mask
28—metallized contact region
29—substrate layer
30—printed circuit board
31—support element
32—conductor track
33—beveled end region
34—pit

The invention claimed is:

1. A method for the production of an electro-optical printed circuit board, having a number of layers with electrically conductive elements, and at least one optical layer with optically conductive elements, wherein the at least one optical layer has a polysiloxane material, and wherein structuring of the elements in a form of channel waveguides of the at least one optical layer takes place by means of casting into a casting mold that contains the waveguide structures as a negative mold, whereby a mechanical connection between the at least one optical layer and at least one layer of the electrically conductive printed circuit board layers is produced in direct connection with the production of the at least one optical layer.

2. The method according to claim 1, wherein the mechanical connection between the at least one optical layer and the at least one layer of the electrically conductive printed circuit board layers is produced directly during the production of the elements of the at least one optical layer.

3. The method according to claim 2, wherein the at least one optical layer is formed from a core polysiloxane having a higher index of refraction, as well as a first polysiloxane as a superstrate layer, having a low index of refraction, and a second polysiloxane as a substrate layer, having a low index of refraction, in the form of cover layers on the core polysiloxane.

4. The method according to claim 3, wherein the first polysiloxane is applied to the core polysiloxane, which has already solidified, in liquid form, brought into connection with the at least one layer of the electrically conductive printed circuit board layers in its liquid phase, and subsequently cross-linked.

5. The method according to claim 4, wherein after cross-linking of the superstrate polysiloxane layer or the substrate layer, the at least one layer of the electrically conductive printed circuit board layers is mechanically fixed in place on the superstrate polysiloxane layer or the substrate layer.

6. The method according to claim 3, wherein the second polysiloxane is applied to the core polysiloxane, which has already solidified, in liquid form, brought into connection with the at least one layer of the electrically conductive printed circuit board layers in its liquid phase, and subsequently cross-linked.

7. The method according to claim 3, wherein pit structures of a casting mold are filled with the core polysiloxane, the core polysiloxane having a higher index of refraction, and hardened, in a first step; the first polysiloxane having a low index of refraction is applied as the superstrate layer, in a second step, in such a manner that the superstrate layer bonds to the core polysiloxane, the superstrate layer with having the optically conductive elements situated on the superstrate layer; the superstrate layer with the optically conductive elements is separated from the casting mold, in a third step; and the second polysiloxane having a low index of refraction is applied to the core polysiloxane as the substrate layer, in a fourth step.

8. The method according to claim 7, further comprising producing coupling elements for optical coupling of the optically conductive elements to electrically conductive elements of the electrically conductive printed circuit board layers to be functionally connected at the same time when the at least one optical layer having the optically conductive elements is cast.

9. The method according to claim 8, wherein the pit structures for the optically conductive elements possess beveled flanks at ends of the pit structures; and wherein the at least one optical layer has molded segments that are metallized locally via said flanks after unmolding, and then function as integrated deflection mirrors.

10. The method according to claim 3, wherein the polysiloxane substrate having the low index of refraction is produced by means of casting technology, with pit structures, in a first step; wherein the core polysiloxane having a higher index of refraction is filled into the pit structures in a second step to form a composite of polysiloxane substrate/core polysiloxane; and wherein the first polysiloxane having a low index of refraction is applied to the composite of polysiloxane substrate/core polysiloxane as the superstrate layer, in a third step.

11. The method according to claim 3, wherein the at least one layer of the electrically conductive printed circuit board layers has micro-structured spacers on a side facing the second polysiloxane in a liquid phase of the substrate layer or the first polysiloxane in a liquid phase of the superstrate layer, respectively, which guarantee a defined thickness of the substrate layer or superstrate layer, respectively.

12. The method according to claim 1, wherein the mechanical connection between the at least one optical layer and the at least one layer of the electrically conductive printed circuit board layers is produced subsequent to production of the at least one optical layer.

13. The method according to claim 12, wherein the at least one optical layer comprises at least one of a polysiloxane substrate, a polysiloxane core, and a polysiloxane superstrate and is first produced as an independent layer, and subsequently mechanically connected with one or more layers of the electrically conductive printed circuit board layers either on one or both sides of the electrically conductive printed circuit board layers.

14. The method according to claim 13, wherein the at least one optical layer is mechanically connected with the one or more layers of the electrically conductive printed circuit board layers via lamination or gluing.

15. The method according to claim 1, wherein the at least one optical layer with optically conductive elements is handled jointly with the at least one layer of the electrically conductive printed circuit board layers during production of the electro-optical printed circuit board.

16. The method according to claim 1, wherein adhesion promoters are used to support the mechanical connection of the polysiloxane material of the at least one optical layer with the at least one layer of the electrically conductive printed circuit board layers.

17. The method according to claim 16, wherein a polymer layer that adheres to the at least one layer of the electrically conductive printed circuit board layers is applied to the at least one optical layer as an adhesion promoter.

18. The method according to claim 1, wherein a physical and/or chemical treatment of a surface of the at least one layer of the electrically conductive printed circuit board layers, said at least one layer being connected with the at least one optical layer, is performed in order to achieve activation of the surface for improved adhesion to the at least one optical layer.

19. The method according to claim 18, further comprising influencing adhesion properties of the at least one layer of the electrically conductive printed circuit board layers that is mechanically connected with the at least one optical layer with regard to the at least one optical layer via flaming with gases.

20. The method according to claim 18, further comprising influencing adhesion properties of the at least one layer of the electrically conductive printed circuit board layers that is mechanically connected with the at least one optical layer with regard to the at least one optical layer via plasma irradiation.

21. The method according to claim 1, wherein the optically conductive elements are structured by casting essentially at ambient temperatures.

22. The method according to claim 1, wherein during casting of the optically conductive elements, a cast optically conductive surface of the optically conductive elements is drawn off by ductors and thereby the casting mold is filled completely.

23. The method according to claim 1, wherein via casting techniques for structuring the optically conductive elements, large-area structures of the optically conductive elements are produced.

24. The method according to claim 1, wherein the polysiloxane material has elastic properties and is unmolded from casting technology depressions having very steep walls or depressions having undercuts, without impairment, because of the elastic properties of the polysiloxane material.

25. The method according to claim 1, wherein the optically conductive elements of the at least one optical layer contain intersections, branches, mixers, wavelength multiplexers and wavelength de-multiplexers, and switching elements.

26. The method according to claim 1, wherein the optically conductive layer made of a polysiloxane material temperature stabilizes the at least one optical layer of the electro-optical printed circuit board without impairment of optical properties of the elements of the at least one optical layer.

27. The method according to claim 1, wherein the printed circuit board is formed from at least one material selected from the group consisting of fiberglass-filled epoxy resin, Kapton, Teflon and glass, the board not being provided with electrically conductive layers at all, or provided with electrically conductive layers on one side or both sides of the board.

28. The method according to claim 1, wherein the printed circuit board is provided with electrical conductor tracks on one side or both sides of the printed circuit board.

* * * * *

UNITED STATES PATENT AND TRADEMARK OFFICE
CERTIFICATE OF CORRECTION

PATENT NO. : 7,630,592 B2
APPLICATION NO. : 10/575125
DATED : December 8, 2009
INVENTOR(S) : Neyer et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 130 days.

Signed and Sealed this

Second Day of November, 2010

David J. Kappos
*Director of the United States Patent and Trademark Office*